(12) United States Patent
Ratautas et al.

(10) Patent No.: US 12,336,114 B2
(45) Date of Patent: Jun. 17, 2025

(54) METHOD FOR SELECTIVE METALLISATION OF INORGANIC DIELECTRICS OR SEMICONDUCTORS

(71) Applicant: VALSTYBINIS MOKSLINIU TYRIMU INSTITUTAS FIZINIU IR TECHNOLOGIJOS MOKSLU CENTRAS, Vilnius (LT)

(72) Inventors: Karolis Ratautas, Vilnius (LT); Gediminas Raciukaitis, Vilnius (LT); Aldona Jagminiene, Vilnius (LT); Ina Stankeviciene, Vilnius (LT); Eugenijus Norkus, Vilnius (LT)

(73) Assignee: VALSTYBINIS MOKSLINIU TYRIMU INSTITUTAS FIZINIU IR TECHNOLOGIJOS MOKSLU CENTRAS, Vilnius (LT)

( * ) Notice: Subject to any disclaimer, the term of this patent is extended or adjusted under 35 U.S.C. 154(b) by 202 days.

(21) Appl. No.: 18/340,111

(22) Filed: Jun. 23, 2023

(65) Prior Publication Data

US 2024/0407107 A1  Dec. 5, 2024

(30) Foreign Application Priority Data

Jun. 1, 2023  (LT) ..................... 2023 521

(51) Int. Cl.
*H05K 3/18* (2006.01)
*C03C 17/10* (2006.01)
(Continued)

(52) U.S. Cl.
CPC .............. *H05K 3/187* (2013.01); *C03C 17/10* (2013.01); *C03C 23/0025* (2013.01);
(Continued)

(58) Field of Classification Search
CPC . C23C 18/1608; C23C 18/1612; C03C 17/10; H05K 3/182
See application file for complete search history.

(56) References Cited

U.S. PATENT DOCUMENTS

2014/0284849 A1* 9/2014 Liu ..................... C23C 18/405
264/446
2017/0094801 A1  3/2017 Choi et al.
2019/0182962 A1  6/2019 Gong et al.

FOREIGN PATENT DOCUMENTS

CN       201210559428      12/2012
CN        102850091 B       4/2014
(Continued)

OTHER PUBLICATIONS

Bulgakova et al. Electronic transport and consequences for material removal in ultrafast pulsed laser ablation of materials. Phys. Rev. B 69, 054102 (2004).
(Continued)

*Primary Examiner* — Alex A Rolland
(74) *Attorney, Agent, or Firm* — Brown & Michaels, PC (57) ABSTRACT

This invention describes a process for selectively depositing metal on the surfaces of inorganic dielectric materials such as glass, ceramics, or semiconductor materials. The method enables the rapid and precise formation of electric circuits on both flat and three-dimensional surfaces. The production method includes steps: firstly, treatment of an item surface with an ultrashort pulse laser of the areas for metallisation, seconds step pre-treatment with the R—OH solution followed by metal salt catalyst activation in a bath and finally electroless metal plating. During immersion in the metal salt catalyst activation bath, localized R—OH molecules on the item's surface act as reducing agents, facilitating the reduction of metal ions from the activation bath. This results in the formation of catalytic seeds exclusively at the laser-modified
(Continued)

areas. The metal layers exhibit high adhesion to the dielectric surface due to the formation of chemical bonds.

21 Claims, 1 Drawing Sheet

(51) Int. Cl.

| | | |
|---|---|---|
| *C03C 23/00* | (2006.01) | |
| *C23C 18/16* | (2006.01) | |
| *C23C 18/18* | (2006.01) | |
| *C23C 18/40* | (2006.01) | |
| *H05K 1/03* | (2006.01) | |
| *H05K 3/00* | (2006.01) | |

(52) U.S. Cl.
CPC ...... *C23C 18/1608* (2013.01); *C23C 18/1868* (2013.01); *C23C 18/1893* (2013.01); *H05K 1/0306* (2013.01); *H05K 3/0026* (2013.01); *C03C 2217/253* (2013.01); *C03C 2218/31* (2013.01); *C23C 18/405* (2013.01); *H05K 2203/072* (2013.01); *H05K 2203/107* (2013.01)

(56) References Cited

FOREIGN PATENT DOCUMENTS

| | | | | |
|---|---|---|---|---|
| CN | 111342204 A | * | 6/2020 | ............ C04B 41/51 |
| DE | 19723734 A1 | | 12/1998 | |
| EP | 1191127 A1 | | 3/2002 | |
| JP | H06140742 A | | 5/1994 | |
| JP | 2008041938 A | | 2/2008 | |
| JP | 2016138304 A | | 8/2016 | |
| JP | 2016180160 A | | 10/2016 | |
| JP | WO2016152938 A1 | | 10/2017 | |
| KR | 20030047382 A | | 6/2003 | |
| KR | 101599422 B1 | * | 3/2016 | ............ H05K 3/00 |
| WO | 2018051210 A1 | | 3/2018 | |

OTHER PUBLICATIONS

Chen et al. "Water Adsorption on Hydrophilic and Hydrophobic Surfaces of Silicon", J. Phys. Chem. C 2018, 122, 21, 11385-11391 (2018) https://doi.org/10.1021/acs.jpcc.8b01821.

Lin et al. "Water adsorption on silica and calcium-boroaluminosilicate glass surfaces—Thickness and hydrogen bonding of water layer", 104, 1568-1580 (2021) DOI: 10.1111/jace.17540.

* cited by examiner

METHOD FOR SELECTIVE METALLISATION OF INORGANIC DIELECTRICS OR SEMICONDUCTORS

TECHNICAL FIELD OF INVENTION

The invention relates to a process for selective metal plating on inorganic materials such as glass, ceramics, composites and semiconductors by electroless deposition of a metal layer on a surface of an article in predetermined areas, treated by a pulsed laser.

BACKGROUND OF INVENTION

There is a high demand from the electronics industry for methods of electro-conductive circuit trace formation on various dielectric materials like glasses. A high integration level of electronics requires dense distribution of interconnections with a minimal width. In addition, 3D mechatronic integrated devices are rapidly expanding, in which electrical circuit traces are formed directly on a 3D-shaped dielectric article body. Various types of electric carriers are pushed by new application areas and pushed by advantageous 3D printing methods. However, there are few technologies enabling circuit formation on complex-shaped articles.

There are known methods for selective metallisation of inorganic dielectric (insulating) materials, like glasses and ceramics, where areas of selective metallisation are defined by laser beam modification of surface physical or chemical properties. They could be grouped:
1. Deposition of a seed layer on the surface of an item made of dielectric material and later removal of the layer in the predetermined areas, which should not be metallised by selective laser ablation, followed by electroless metal deposition on the remaining seed layer. The seed layer could be an electro-conductive polymer or thin metal film.
2. Laser ablation of tranches and cavities in the areas to be metallised followed by metal deposition (evaporation etc.) with later removal on laser not treated areas.
3. Special (photo-sensitive) additives are mixed into the substrate material.
   a. Photosensitive glass (FUTORAN) with silver doping,
   b. Ceramics containing oxides of a particular group of metals,
   c. Metallo-organic materials mixed into polymers (LDS).

H. Juergen et all in EP1191127A1 (2000 Mar. 26) present a process for metallizing plastic or ceramic materials, which includes the deposition of an activating layer made of conducting material on the dielectric substrate, structuring the activating layer by a laser so that discrete conducting structures are produced, which are later metallised by electroless plating. The activating layer could be made of conductive polymer, conductive polymer with Pd and/or Cu nuclei, metal sulphides or metal polysulfides, a thin metal layer. Laser treatment is performed by nanosecond KrF, XeCl or Nd-YAG lasers.

The activation layer deposition of conductive polymer on 3D parts is complicated in mass production and metal adhesion to the substrate is controlled by the adhesion of the conductive film to a substrate. Moreover, the layer materials are expensive, which complicates the application for various industries.

In patent application CN201210559428 (2012 Dec. 21), a method of selective ceramic surface metallisation is described, which uses irradiation of a continuous metal film on the substrate surface by a laser. Due to the high temperature after laser irradiation, the metal locally diffuses into the ceramics, doping it with a metal and welding the metal film to the ceramics, removing the metal film from the unselected regions and carrying out chemical electroplating on the laser-irradiated regions.

The method requires complex steps and wastes materials. Metal film formation is performed by physical vapour deposition, which is a very slow process. The metal film from non-irradiated areas should be removed in additional steps before electroplating. Doping the substrate from the metal film by diffusion is limiting the spatial resolution of selective plating and applications in high-density electronic integration.

CN111342204A (2018 Dec. 19) provides a manufacturing method for a three-dimensional laser-etched 5G antenna on the ceramic material surface. The method comprises soaking ceramic in a catalyst solution (the mixture of alcohol, aldehyde and titanium dioxide with a concentration of 15% to 30% in water). Irradiation with an infrared nanosecond laser (4-200 ns) transforms the hydroxyl or aldehyde groups from the catalyst solution into carboxylic groups in the laser-irradiated areas. When the article is immersed in a metal ion solution, the carboxyl groups on the ceramic surface react with the metal ions and form stable complexes. After this step, the ceramic article is immersed in a solution containing multiple reducing agents (hydrazine, stannous chloride, hypophosphite, borohydride, thiosulfate, etc.), and the complexes with metal ions are reduced to metal nuclei. Finally, the antenna is formed on the surface of the ceramic substrate by electroless deposition.

There are doubts about process selectivity, as the article is fully immersed in a catalyst solution, and then, without any catalyst removal from non-irradiated areas, the article is immersed in a reducer bath. Adhesion of the metal film should be weak as no chemical bonds are created with the substrate. The process has a lot of steps containing various chemical compounds like multiple reducers in a bath. Moreover, there is activator layer is formed prior laser process, thus limiting the processing of complex 3D-shaped bodies.

In patent application US2017094801, Choi Seung Hyuk describes a method of manufacturing circuit having a lamination layer using LDS (Laser Direct Structuring DE19723734A1) to ease the application of surface structure for the applied product of various electronic circuits and particularly, which can form circuit structure of single-layer to multiple-layer on the surface of an injection-moulded substrate in the shape of a plane or curved surface, metal product, glasses, ceramic, rubber or other material.

The process uses LDS additives for the lamination layer. Such a process is not applicable to many industrial mass-production processes due to too high cost of LDS additives. Moreover, the application to transparent substrates is limited or impossible since the lamination layer is not transparent. In addition, the lamination of complex curved 3D objects complicates the production process.

KR20030047382 (2001 Dec. 10) J. C. Bo et al. disclose a circuit forming method which comprises the first step of forming a circuit wiring by etching an insulating material such as ceramic or glass into a predetermined depth through the use of a laser, the second step of filling the circuit wiring with a conductive material such as Au or Cu, and the third step of firing the embedded in the groove conductive material. A conductive metal film other than the groove is removed to form a fine pattern.

The process can fabricate circuits only on planar surfaces because the coating process is performed with paste deposition over the surface. In addition, the paste-firing process complicates the application for many substrates and increases the production cost.

JPH06140742 (1992 Oct. 29) K. Masayuki discloses the method where ceramic or glass substrate is irradiated with ultraviolet laser beams to form pattern trenches. Next, Au or Cu, as a highly conductive metal, is bonded onto the whole surface of the substrate by evaporating or sputtering step, etc., and then the surface is polished to form fine patterns. Due to the short wavelength and high photon energy of the ultraviolet laser beams, the trenches in the substrate could be made precisely.

Application of the method is limited to flat surfaces as polishing to remove the metal film from the substrate is used. The sputtering or evaporation process is a slow vacuum process to form a sufficient thickness of the conductor layer in laser-ablated trenches, and the removal of most of the metal film is a waste of materials.

In JP2016138304 (2015 Jan. 27), Y. Atsushi discloses a method of plated component fabrication which includes moulding a component of a resin material containing transparent glass fillers and a hydrophilicity-imparting material—amorphous nylon—in an amount of 1% by weight to 20% by weight. Iodine is applied to the surface of the component and later irradiated by a $CO_2$ laser beam of a part of the component surface to remove iodine. The next step is depositing an electroless plating catalyst on the surface areas of the component, which were irradiated with the laser beam, and bringing the electroless plating solution into contact with the surface of the component to which the electroless plating catalyst is attached, to form an electroless plating film on the component.

In JP2016180160 (2015 Mar. 24), Nishimura et al. disclose a method for manufacturing a device having a metal film pattern formed on the surface of a glass substrate. The production method of the device includes a first step for irradiating a region of a part of the surface of the glass substrate with a pulse laser so that cavities are formed on the glass surface and a second step for allowing metal particles to collide with the surface of the glass substrate by a cold spray method, to form a metal film selectively only on the region irradiated with the pulse laser. The pulse width of the laser could be from attoseconds ($10^{-18}$ s) to milliseconds ($10^{-4}$ s). The third step of forming a plating film on the surface of the metal film includes electroplating or electroless plating.

The application teaches that a pulsed laser is used to ablate cavities, where metal particles are captured after cold spay. The cold spray method possesses challenges for application on the free-form surface.

In CN102850091B (2011 Jun. 28) Ren Yong Peng et al. discloses a method for selective metallisation of a ceramic surface. The method includes performing screen printing to a surface of a ceramic substrate by adopting aluminium nitride paste which is a mixture containing an organic solvent, glass powder and aluminium nitride, drying and sintering the paste to obtain ceramic having a surface provided with a pre-prepared layer. Selected regions of the ceramic surface are irradiated by an energy beam to form chemical plating active centres for the chemical plating of a metal layer at the selected region. The energy beam could be a continuous wave laser, an electron beam or an ion beam, and the ceramic substrate is alumina or aluminium nitride ceramics.

The mentioned method uses aluminium nitride paste, screen printing and high-temperature sintering before activation with an energy beam and electroless plating.

A method described by US2019182962A1 (2011 Jun. 13) suggests selectively metallising a surface of a ceramic substrate. It comprises three steps of moulding and sintering a ceramic composition to obtain the ceramic substrate from a mixture of a ceramic powder and a functional powder dispersed in the ceramic powder, radiating a predetermined region of the surface of the ceramic substrate using an energy beam to form a chemical plating active centres and performing chemical plating. The ceramic powder is at least one selected from a group consisting of an oxide, a nitride, an oxynitride, and a carbide of Li, Na, K, Rb, Cs, Be, Mg, Ca, Sr, Ba, B, Al, Ga, Si, Ge, P, As, Sc, Y, Zr, Hf and the functional powder is at least one selected from a group consisting of an oxide, a nitride, an oxynitride, a carbide, and a simple substance of Ti, V, Cr, Mn, Fe, Co, Ni, Cu, Zn, Nb, Mo, Tc, Ru, Rh, Pd, Ag, Cd, Ta, W, Re, Os, Ir, Pt, Au, In, Sn, Sb, Pb, Bi, Ce, Pr, Nd, Pm, Sm, Eu, Gd, Tb, Dy, Ho, Er, Tm, Yb, and Lu. The amount of the functional powder could be up to 30 wt % in the ceramics to make the material sensitive to the energy beam irradiation. The applicability of laser, electron or ion beams for material modification suggests thermal dissociation of the functional material inside ceramic to prepare catalytic plating centres.

The problem with this method is that the process required doping the ceramic material for selective activation—specific metal compounds to be activated with laser and plated afterwards in the electroless plating bath. However, the method could not be applied for pure ceramics without special substance additives for activation, thus limiting technology application for the areas where ceramics without special additives are preferred. Moreover, functional material is mostly rare earth metals, which are very expensive materials.

In patent application WO2018051210 (A1) (2016 Sep. 13), K. Ratautas discloses a method for the formation of electro-conductive traces on polymeric article surface using irradiation selected areas of the substrate by ultrashort pulse laser and activation of the surface my metal ions from aqueous solution before electroless metal plating. The method is based on breaking molecular bonds in polymers and exposing surface charge. The method is limited to organic dielectrics as a substrate for interconnection formation.

In JP2008041938A (2006 Aug. 7), H. Yasutaka discloses a method for forming the metal interconnection on the surface of the photosensitive glass containing 15% silver ions. The method comprises irradiating a surface of an insulator transparent to a wavelength of laser light and containing silver ions with picosecond or femtosecond pulse laser radiation. Due to multiphoton absorption at the focusing point, silver ions change their charge state. Heat treatment is performed at a predetermined temperature for a predetermined time reducing the laser-excited silver ions to silver atoms in the irradiated region before the insulator, irradiated with the laser light, is immersed in the electroless plating solution.

The method is applicable only to a special, photosensitive glass doped by silver, gold or copper as a sensitizer. That limits the selection of materials and applications.

In KR101599422 (2015 Apr. 8), K. B. Soo disclosed the method for forming a metal pattern on tempered glass. The method comprises forming a pattern by etching a surface of a base material of tempered glass with a laser; swelling the pattern is performed by immersing in an alkaline aqueous solution at a temperature of 70 to 80° C.; adsorbing a catalyst inside the pattern by immersing the tempered glass having the swelled pattern in a catalyst solution, containing ammonia palladium chloride; immersing the tempered glass substrate soaked in the catalyst solution in an aqueous sulfuric acid solution, and plating with metal on the catalyst adsorbed inside the pattern of the tempered glass. According to the present invention, an accurate metal pattern that has excellent adhesion to the tempered glass and is selective can be formed. a UV (ultraviolet) laser with a short wavelength of 300 to 355 nm is used for pattern formation to avoid crack formation in the tempered glass.

The disadvantages of this method are that process is limited to the tempered glass substrate. Moreover, the embodiment of the technology uses a palladium-based catalyst substance, which makes the process expensive and unattractive for industrial applications.

In JP20150061779A•(2015 Mar. 24), Nishimura disclose a method for producing a plated article in which a plating film pattern is formed on the surface of a glass substrate. This method comprises: irradiating predetermined regions of the surface of the glass with a pulsed laser; attaching an electroless plating catalyst to the surface of the glass substrate; selectively deactivating or selectively removing the catalyst attached to the unirradiated area with the pulsed laser in the glass substrate; and selectively forming a plating film only on the regions that have been irradiated with a pulsed laser by performing electroless plating. The pulse laser could have a wavelength of 100 to 12000 nm, an average output at the processing point of 0.01 to 1000 W, and a pulse width of $1\times10^{-18}$ to $1\times10^{-4}$ seconds, the frequency is 1 kHz to 1000 MHz. The catalyst could be selected from palladium (Pd), silver (Ag), copper (Cu), nickel (Ni), aluminium (Al), iron (Fe), and cobalt (Co).

The method requires a deactivating step for the surface which is not irradiated by a laser, thus claiming that in the activation step, the whole surface becomes active after bringing the surface in the contact with catalyst substance. The deactivation step is performed using a solution of a special material: a sulphur compound or a mixture consisting of a thiocarbonyl group, a thiol group and a sulphide group or a chelate compound or cyanide. The compound that removes the catalyst could be also at least one chelate compound selected from the group consisting of amino acids, aminoalcohols, polyamines, polycarboxylic acids, and polyketones.

The disadvantage of the method is it uses a deactivation process for the non-laser treated surface, thus showing that the whole surface of an article, no matter if it is laser treated or not, is activated by a metal catalyst, therefore the activation step is not selective and requires a deactivation step. An ultrasonic treatment or washing the surface of the glass substrate with running water are not sufficient to remove the activator from laser non-treated areas, and contacting the glass substrate with a liquid containing a compound that deactivates the catalyst is necessary. The activation of the whole surface and deactivation after leads to poor plating resolution or spatial selectivity. Therefore, it limits the application areas for microelectronics where narrow electric traces and small plating pitch is required. Moreover, the process contains a large number of expensive and hazardous chemical compounds in the deactivation bath. In addition, the deactivation process increases the processing time and is less attractive for industrial applications.

The Technical Problem to be Solved

The invention aims to create economically viable technology of selective metal deposition on inorganic dielectrics and semiconductors, like glass, ceramic, silicon, etc. without any special additives in a substrate material or any intermediate layer for applications in electronics by forming conductive circuits or other application areas where selective metallisation of a dielectric surface is needed. The method can be used for 3D mechatronic integrated devices. Moreover, the proposed method can increase the density of conductor lines in circuits, by improving the selectiveness of the metallisation process and, therefore, increasing the spatial resolution of selective metal deposition. In addition, the method can be applied to transparent dielectric materials. Therefore, a narrow metal mesh structure formed on transparent material could be applied as a transparent conductive electrode.

DISCLOSURE OF THE INVENTION

According to the proposed invention method for selective metallisation of inorganic dielectrics or semiconductors comprising steps:
surface modification with a pulse laser on the item areas to be plated by a metal;
bringing the item with the laser-modified surface in contact with a pre-treatment solution;
immersing the item in a catalyst activation bath, and metal plating in an electroless metal plating bath, wherein:
the surface modification is performed with an ultrashort pulse laser leading to static electrical charge formation on the item surface,
parameters of the ultrashort laser pulses are chosen so that the static electrical charge formed on the item surface initiates the formation of hydroxy groups on the laser-treated surface by adsorbing water molecules from the ambient environment;
the pre-treatment solution contains a mixture of a compound described by the formula R—OH and water, where R is a radical molecule, which does not dissociate in water;
upon bringing the item with the laser-modified surface in contact with the pre-treatment solution, the R—OH molecules are adsorbed and localised in the laser-modified areas;
the catalyst activation bath is a metal salt activation bath;
upon immersing the item in a metal salt catalyst activation bath the localised R—OH molecules on the surface of the item act as reducing agents to facilitate the reduction of metal ions from the activation bath, thereby forming catalytic seeds exclusively at the laser-modified areas.

Parameters of the ultrashort laser pulses are chosen so that when the laser pulse radiation interacts with the dielectric material, a static electric charge occurs on the surface of the dielectric material due to the Coulomb explosion.

Parameters of the ultrashort laser pulses are chosen so that when the laser pulse radiation interacts with the dielectric material, a static electric charge occurs on the surface of the dielectric material due to photochemical ablation (breaking of chemical bonds).

Pulse laser has a pulse duration in the range of 0.005-500 picoseconds.

A wavelength of the laser comprises infrared, visible and ultraviolet range, wherein said irradiation dose is in a range of 0.01-200 J/cm$^2$ and laser scanning speed is in a range of 0.1-20 m/s. and said irradiation dose and scanning speed are chosen such that the laser-irradiated areas become active for hydroxy groups formation and adsorption of R—OH molecule in the pre-treatment bath.

Laser irradiation is performed in a burst mode of laser pulses.

The laser beam translation is performed with a galvanometric scanner.

The laser beam is a Bessel beam, shaped with an axicon optical element.

The humidity of the ambient environment during the process is maintained within a range of 15% to 95%.

The pre-treatment bath is a mixture of water and alcohol at a concentration rate from 1% to 99.998% alcohol.

The item after pre-treatment with a pre-treatment solution is brought into contact with the activation batch at a time scale from 0.01 s to 10 min.

The activation solution used for chemical activation is an aqueous solution of a metal salt selected from the list of salts consisting of silver (Ag) salt, copper (Cu) salt, nickel (Ni) salt, cobalt (Co) salt, zinc (Zn) salt, chromium (Cr) salt, or tin (Sn) salt.

The pre-treatment solution is an alkaline alcohol-containing bath with a pH value higher than 7.0.

The alcohol-containing bath consists of mono-hydroxyl and poly-hydroxyl alcohols.

The pre-treatment bath consists of an ethanol and water mixture.

The pre-treatment bath consists of an isopropanol and water mixture.

The pre-treatment bath consists of a water and pentanol mixture.

After immersion in the activation bath, the article is rinsed in water.

The surface to be plated is glass selected from a group comprising silicate glass, soda-lime glass, borosilicate glass, fused silica, float glass, aluminosilicate glass, lead glass, borate glass fluorine glass, phosphate glass.

The surface to be plated is ceramics selected from a group comprising alumina, zirconia, SiC, AlN, $Al_2O_3$, silicon nitride, boron nitride, barium titanate, ferrite ceramics.

The surface to be plated is a semiconductor.

The surface to be plated is silicon or germanium.

Metal ion reduction occurs due to the metal oxide formation by metal ion reaction with $OH^-$ ions in an alkaline medium and subsequent metal oxide reduction by alcohol molecule.

Metal reduction occurs due to metal ion reaction with hydroxide in the alkaline pre-treatment bath.

Metal reduction occurs due to metal ion reaction with hydroxide in the alkaline electroless plating bath.

Advantages of the Invention

The present invention is related to electric circuit formation on inorganic dielectric materials and semiconductors. There are several relevant practical advantages of the present invention. First, the process enables to deposit of circuits on free-form inorganic dielectric carriers. Second, standard commercial materials without any special additives or dopants can be used as a substrate for the devices, permitting easy recycling of materials after the end-of-life of a product. Third, surface activation by an ultrashort pulse laser allows to achievement of very narrow metal lines with a micrometre-scale pitch. In addition, the technology enables fast and inexpensive prototyping of new products. Moreover, the process is a material-saving process, where the metal plating is achieved selectively without any subtractive procedure or etching. The invented method consists of 4 main steps: 1) selective surface activation of the areas of inorganic dielectric or semiconductor to be plated by an ultrashort pulse laser; 2) Surface preparation for catalyst by immersing in the pre-treatment bath; 3) dip in a metal salt catalyst bath and 4) electroless catalytic metal plating.

BRIEF DESCRIPTION OF THE DRAWINGS

The invention is explained in greater detail in the following drawings, wherein.

DESCRIPTION OF THE INVENTION AND EXAMPLES

Electro-conductive circuit formation on 3D-shaped dielectrics is one of the biggest challenges in the manufacturing of 3D Mechatronic Integrated Devices (3D-MID). New manufacturing methods, such as 3D printing and new applications, place a strong need to form electrical circuits on 3D free-form shaped inorganic dielectric materials, such as ceramics, glass, or composites. In addition, the fast-growing semiconductor industry is looking for new ways to form electrical circuits, for example, on silicon and other semiconductors for solar cells or heterogeneous chip integration. The presented advanced technology of laser-initiated selective metal deposition can solve emerging production issues for electric conductors. It is a material-saving selective process. The technology process of the present invention contains 4 main steps: laser modification of the dielectric surface, surface pre-treatment with pre-treatment bath, chemical activation of modified areas and electroless plating of activated parts. A detailed description of the process steps is given as follows:

The first step is irradiation surface areas of an item made of inorganic dielectric or semiconductor which are intended to be deposited by a metal with an ultrashort pulse laser. Areas provided for metallisation are irradiated with an ultrashort pulse laser. Pulse duration comprises from 0.005-500 picoseconds. The laser wavelength comprises the infrared, visible and ultraviolet ranges. Irradiation dose is from 0.01 to 200 $J/cm^2$.

Interaction of ultrashort (<500 ps) laser pulses with dielectric materials is a multiphoton process including multi-photon absorption and impact ionisation. A high rate of photon energy deposition to the material leads to the Coulomb explosion. The electrons are transferred from the valence to the conduction band and continue to absorb energy by inverse bremsstrahlung. If their energy exceeds a critical value, the electrons are ejected, leaving uncompensated positive charges in the laser-affected region due to the excess of cations. [Bulgakova, N. M., Stoian, R., Rosenfeld, A., Hertel, I. V., Campbell, E. E. B., Electronic transport and consequences for material removal in ultrafast pulsed laser ablation of materials. Phys. Rev. B 69, 054102 (2004)]. In compound material intensive laser radiation leads to photo-chemical ablation with broken interatom bonds. The surface of the material becomes positively charged.

All laser parameters are experimentally selected to cause a change in the surface electric potential of the irradiated area, resulting in a positive potential with respect to the ambient air, as an effect of the induced static electric charge in the laser-irradiated region. The irradiation dose should exceed some threshold dose, dependent on the substrate material.

A positively charged surface initiates hydroxy group formation on the laser-treated surface by adsorbing water molecules from ambient humidity. The adsorbed molecules fix the status of laser-treated surfaces and preserve them from charge compensation by electron diffusion from materials volume. [Y.-T. Lin, N. J. Smith, J. Banerjee, G. Agnello, R. G. Manley, W. J. Walczak, S. H. Kim, Water adsorption on silica and calcium-boroaluminosilicate glass surfaces—Thickness and hydrogen bonding of water layer, 104, 1568-1580 (2021) DOI: 10.1111/jace.17540]. Hydroxy groups can be also formed in a water-based pre-treatment bath.

The proposed method of selective metal plating is applicable to inorganic dielectric and semiconducting materials. The item can be produced from ceramics: Alumina (aluminium oxide, $Al_2O_3$), Zirconia (zirconium oxide, $ZrO_2$), Silicon Nitride ($Si_3N_4$), SiAlON (alumina substituted into silicon nitride), Aluminium Nitride (AlN), Boron Nitride (BN), Tungsten Carbide (WC), Boron Carbide ($B_4C$), Diamond, Silicon Carbide (SiC), Bauxite ($Al(OH)_3$), Magnum Oxide (MgO), glass ceramics.

The item can be produced from glasses or crystalline materials as an example: soda lime glass, fused silica, borosilicate glass, sapphire, float glass.

The item can be produced from semiconductors: Silicon (Si), Germanium (Ge), Gallium Arsenide (GaAs), Silicon Carbide (SiC), Gallium Nitride (GaN), Gallium Oxide (GaO). The embodiments disclosed herein are provided for illustrative purposes, but should not be construed as limiting the scope of the invention. The examples presented are intended to be non-limiting and are merely illustrative of certain embodiments.

After laser surface treatment, the specimen is brought in contact with a pre-treatment solution. The pre-treatment solution contains a mixture of a compound described by the formula R—OH with water, where R is a radical molecule which does not dissociate in water and OH is a hydroxy group. The concentration ratio of the R—OH compound in the pre-treatment solution ranges from 1% to 99.9998% by mass. the pre-treatment solution includes hydroxyl or hydroxy-methyl groups containing compounds or both and a water mixture. As an example, the pre-treatment bath can consist of monohydroxy or polyhydroxy alcohols, Phenols, Alkyl hydroperoxides, Ethers, Alkyl phenols, Glycols, Alkyl hydroxamic acids, Carboxylic acids, Hydroxy acids, Alkyl hydrogen carbonates etc.

The embodiments disclosed herein are provided for illustrative purposes, but should not be construed as limiting the scope of the invention. The examples presented are intended to be non-limiting and are merely illustrative of certain embodiments. The pre-treatment can be applied as a bath step by immersing the specimen or spray or any other method which can bring the process surface into contact with the solution. In the alcohol-containing pre-treatment bath, the laser-processed surface with localised OH groups attracts R—OH molecules from the pre-treatment bath by electrostatic forces to form hydrogen bonds (chemisorption). The localized R—OH molecules act as catalysts and reduce the metal ions, thereby forming catalytic seeds exclusively at the laser-modified areas within the activation bath. The examples presented are intended to be non-limiting the localisation force or interaction and are merely illustrative of certain embodiments. In addition, R—OH can be localised physically, electrostatically or forming other types of chemical bonds, like covalent or ionic bonds.

Figure 1:
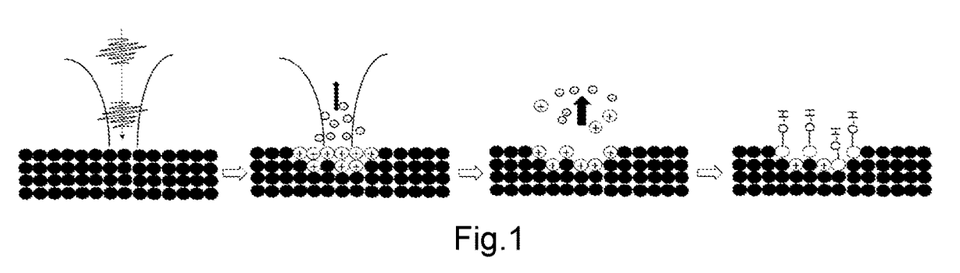
FIG. 1 shows the basic scheme of OH group localisation.

In the case of glass and silicon, the silanol groups are formed at the interface of the alcohol-containing solution with a laser-modified area. The alcohol-containing solution could be a water and alcohol mixture. The mechanism by which the laser-modified glass and silica surfaces gain charge upon contact with water is the adsorption of the hydroxy group by the silanol group, thereby increasing the OH concentration in the laser-modified areas.

$$Si-OH \ldots OH^- \tag{1}$$

In the case of ceramic materials, the mechanism is similar. For example, aluminium oxide or aluminium nitride also forms OH groups at the alcohol solution interface. The laser-treated surface in an R—OH-containing pre-treatment bath forms aluminium hydroxide compounds. Interfacial water molecules should H-bond to $(Al)_2OH$ at the surface with their O attached to the —OH groups of the alumina surface.

The basic scheme of OH group localisation is shown in FIG. 1

Additionally, the hydroxy group formation is initiated by LIPSS structure causing superhydrophilicity at the laser-treated surface, it is especially important for electrically conductive materials like semiconductors. Strong hydrogen bonds can be formed on a hydrophilic OH-terminated native oxide layer on silicon.

[Lei Chen, Xin He, Hongshen Liu, Linmao Qian, Seong H. Kim, Water Adsorption on Hydrophilic and Hydrophobic Surfaces of Silicon, J. Phys. Chem. C 2018, 122, 21, 11385-11391 (2018) https://doi.org/10.1021/acs.jpcc.8b01821].

Laser-induced periodic surface structures (LIPSS) appear on the surface of practically any material irradiated with multiple laser pulses close to the material ablation threshold. LIPSS initiate surface hydrophilicity of inorganic dielectrics and semiconductors. Chemical and structural surface modification work together to localise OH groups in laser-treated areas. Moreover, during laser material interaction, the laser-treated surface is ablated, and a porous surface is developed, thus physically increasing the interaction area with an alcohol-containing bath. The pre-treatment solution is neutral or alkaline. LIPSS localizes $OH^-$ not only mechanically but also electrostatically, as the edges of the small periodic structure accumulate static electric charge.

In addition, superhydrophilicity increases wetting properties at laser-treated areas for the pre-treatment and activation bath. The wetting process is necessary for successful activation treatment with a water-based solution. For example, hydrophobic areas cannot participate in the activation process with an activation solution. The mentioned mechanism also helps to localise OH groups for nonconductive materials like ceramics and glasses.

Ceramics processed with an ultrashort pulse laser, for example, Aluminium oxide, also forms $OH^-$ groups in an air environment due to relative humidity or at the pre-treatment solution interface.

Figure 2:
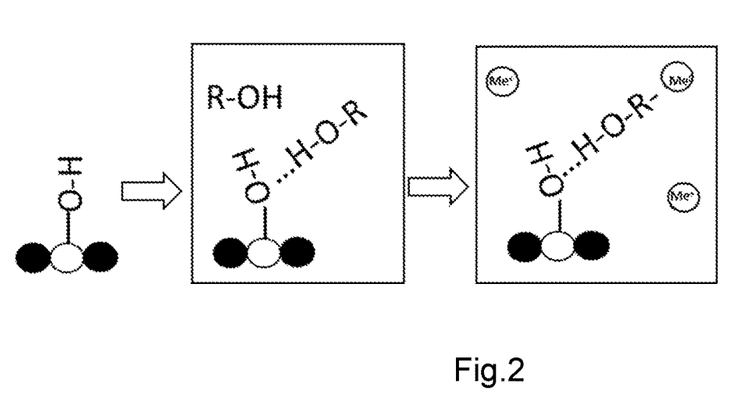
FIG. 2 shows s schematic illustration of the activation process for inorganic dielectric material.

After surface treatment with the pre-treatment solution, the surface of the item is treated in an activation bath. Before the activation bath, the item can be optionally rinsed with water. The activation bath must include an aqueous solution of metal salt comprising but not limited to silver nitrate $AgNO_3$ or silver ammonia complex $Ag(NH_3)_2$, which concentration is in the range of 0.0000001-1 M and temperature being 15-60° C. Metal ions are adsorbed on said laser-treated areas. In the case of silver nitrite or silver ammonia complex, the metal ions are silver ions. Hydroxy groups localised on laser-treated areas preferentially react with metal ions like $Ag^+$ to yield $Ag_2O$, and then these $Ag_2O$ particles are reduced to metallic Ag by R—OH, for example, ethanol in the presence of residual hydroxide ions. Reactions in the case of ethanol molecules and silver-based metal salt activation bath are represented below.

(2)

(3)

(4)

Reduction of the adsorbed metal ion is a key chemical process since the electroless catalytic plating takes place only on a neutral atom of metal. The reaction (4) can be applied to a single metal ion, not only to oxides.

Rinsing of the item in water can be applied additionally. The rinsing is performed in such a way that all silver particles/ions remain on laser-treated areas only. The ions adsorbed on the unexposed areas have to be washed away.

In the case of aluminium ceramics like Aluminium oxide $Al_2O_3$ or Aluminium Nitride, irradiation with a burst of ultrashort pulses can be used. Bursts of laser pulses break the bonds between atoms in the ceramic, creating aluminium catalytic centres. For this process, the activation step with a silver salt bath can be skipped.

FIG. 2. Schematic illustration of the activation process for inorganic dielectric material.

A rinsing procedure can be used before immersing the item in the selected plating bath. The catalytic seeds facilitate further metal deposition in the electroless metal plating bath. An electroless catalytic plating process is used. Laser-treated and chemically-activated areas are metallised during this step. The said bath contains chosen metal ions (for example, copper), a ligand, a reducing agent and a buffer. Various metals: copper, silver, nickel, platinum, palladium, etc., can be used for deposition. The copper plating bath contains copper sulphate $Cu_2SO_4$ in the concentrations of 0.005-0.25 M (copper source), formaldehyde in the concentration of 0.0015-6 M (reducing agent), ligand chosen from the group of polyols, hydroxy-polycarboxylic acids, polyamine-polycarboxylic acids, polyamine-polyhydroxy compounds comprising: glycerol, citric acid, isomers of tartaric acid, EDTA, DTPA, CDTA, N,N,N',N'-Tetrakis (2-Hydroxypropyl)ethylenediamine, in the concentrations of 0.15-0.75 M. The electroless copper plating bath contains in addition sodium carbonate $Na_2CO_3$ in the concentrations of 0.05-0.6 M and sodium hydroxide NaOH in the concentrations of 0.1-2 M—as a buffering environment at pH-values of 12-13. The temperature of the electroless copper plating bath during the process ranges 5-90° C.

As an example, the chemical metallisation solution may consist of 0.12 M copper sulphate ($CuSO_4$), 0.25 M N,N, N',N'-Tetrakis (2-Hydroxypropyl)ethylenediamine ($[CH_3CH(OH)CH_2]_2NCH_2CH_2N[CH2CH(OH)CH_3]_2$), 1.25 M sodium hydroxide (NaOH), 0.3 M sodium carbonate ($Na_2CO_3$) and 0.34 M formalin. The pH value is kept at 12.7. The temperature of the plating process is 30° C.

Firstly, the catalytic anodic oxidation reaction of the formaldehyde-reducing agent takes place in the electroless plating process. Therefore, free electrons appear on the surface of the catalyst as a final product of its oxidation reaction. Following, the cathodic redox reaction of copper ions is being proceeded by free electrons on the catalyst surface (wherein the catalyst firstly are silver atoms, later deposited copper). The yield of the redox process strongly depends on the ligand properties, (both from bonding strength with a metal ion and adhesion on the surface) since a copper ion is not free in the solution and belongs to a complex with ligands. The N,N,N',N'-Tetrakis(2-Hydroxypropyl)ethylenediamine-copper complex has strong adhesion to the catalyst surface, thus, increasing the concentration of copper atoms. Finally, better plating quality is achieved as a result of the higher copper yield on the surface.

Example 1

Materials: a soda lime microscope glass from "Gerhard Menzel B.V. & Co. KG" was used as a substrate.

Laser treatment: the laser source was a picosecond Nd:$YVO_4$ laser (Atlantic, EKSPLA), radiating at the wavelength of 1064 nm. The pulse repetition rate ranged from 50-100 kHz. The average laser power was 1 W. A galvanometric scanner (SCANLAB) was used for the beam translation. The 80 mm F-Theta telecentric objective was applied for laser beam focusing. The diameter of the Gaussian beam on the surface was 35 μm. The width of the conductor bands ranged from a single scanned line up to several lines with a 50% overlap between scans (half of the neighbour lines overlapped each over). The scanning speed was 0.6 m/s at the 100 kHz pulse repetition rate; and 1.2 m/s at the 200 kHz pulse repetition rate.

Chemical activation: An item was immersed in an isopropanol (2-Propanol anhydrous 99.5%) bath at room temperature (20.5° C.) for 3 min.

The item was submerged into silver nitrate ($AgNO_3$) aqueous solution at a concentration of $5 \times 10^{-4}$ M after the laser treatment.

Rinsing: the article was rinsed in distilled water for 5 min.

Metal plating: The activated article was submerged into the copper electroless plating bath immediately after the rinsing. The bath consisted of: 0.12 M $CuSO_4$ (copper sulphate), 0.35 M Sodium potassium tartrate, 1.25 M NaOH (sodium hydroxide), 0.3 M $Na_2CO_3$ (sodium carbonate), 0.34 M $CH_2O$ (formaldehyde), pH=12.7. The plating time was 60 min, at the 30° C. temperature.

The measurement of sheet resistance was also performed using the Keithley 2002 Source Meter. The sheet resistance was $<Rs> = 3 \cdot 10^{-3} \Omega/\square$. The Scotch tape test was applied for an adhesion strength check. The result of the test showed that all the metal lines remained on the substrate surface after the peel-off procedure.

Example 2

Materials: UV Fused silica glass (from "Eksma Optics" UAB) with a thickness of 1 mm.

Laser treatment: the femtosecond laser Yb:KGW Carbide (from Light Conversion) with the second harmonics was used for the surface treatment at the wavelength of 515 nm. The pulse repetition rate was 100 kHz. The average laser power was 5 W. A galvanometric scanner (SCANLAB) was used for the laser beam translation. The 80 mm F-Theta telecentric objective was applied for focusing. The diameter of the Gaussian beam on the sample surface was 32 μm. The curved meander-shaped lines were scanned with the laser. The width of the formed conductor tracks was varied from one scanned line to several lines with 50% overlap (half of the line overlapped with the adjacent one). The scanning speed was 0.5 m/s at a 50 kHz pulse repetition rate.

Chemical activation: after the laser processing, the article was immersed in an ethanol 99.8% bath at room temperature (20.5° C.) for 5 min. After that, the glass article was submerged into silver diamine $Ag(NH_3)_2$ aqueous solution at the concentration of $1 \times 10^{-4}$ M.

Rinsing: The article was rinsed in distilled water.

Metal plating: Following, the activated and rinsed article was submerged into the copper electroless plating bath, which consisted of: 0.12 M $CuSO_4$ (copper sulphate), 0.35 M Sodium potassium tartrate, 1.25 M NaOH (sodium hydroxide), 0.3 M $Na_2CO_3$ (sodium carbonate), 0.34 M $CH_2O$ (formaldehyde). The pH value of the bath was 12.7. The plating procedure lasted 60 min. at the 30° C. temperature.

Example 3

Material: $Al_2O_3$ ceramic (from Terracore Sweden AB)
Laser treatment: the femtosecond laser Yb:KGW Carbide (from Light Conversion) was used as an irradiation source. The galvanometric scanner, the same as in Example 1, was used for the beam translation over the sample surface. The average laser power was 10 W. Laser pulses were set to a burst mode, burst frequency was 1 GHz. 10 pulses in a bust were used.

Activation and plating were performed using the same parameters as in Example 2.

Example 4

Material: crystalline silicon wafer of 200 µm thickness was used as a substrate.
Laser Treatment: Femtosecond laser described in Example 2 was used as an irradiation source. Beam translation was performed using a linear mechanical stage. Laser beam was focused using an optical axicon with a cone angle of 135°. The centre maximum of the focused Bessel beam diameter was ~2 µm. The translation speed was set from 1 to 10 mm/s.

Activation and plating: Activation and plating procedures were carried out as described in Example 1.

Result: narrow copper lines with a width of 1.5 µm were deposited on a silicon wafer.

The invention claimed is:
1. A method for selective metal plating on an item surface of an item made of an inorganic dielectric or semiconductor material, comprising the steps of:
surface modification with a pulse laser on the item surface areas to be plated by the metal;
bringing the item with the laser-modified surface in contact with a pre-treatment solution;
immersing the item in a catalyst activation bath, and
metal plating in an electroless metal plating bath,
wherein the surface modification is performed with an ultrashort pulse laser leading to a static electrical charge formation on the item surface to be plated;
wherein parameters of the ultrashort laser pulses are chosen such that the static electrical charge formed on the item surface initiates formation of hydroxy groups on the laser-modified surface areas by adsorbing water molecules from ambient;
wherein the pre-treatment solution contains a mixture of a compound described by a formula of: R—OH and water, where R is a radical molecule, which does not dissociate in water;
wherein upon bringing the item with the laser-modified surface in contact with the pre-treatment solution, R—OH molecules are adsorbed and localised in the laser-modified areas;
wherein the catalyst activation bath is a metal salt activation bath;
wherein upon immersing the item in the metal salt catalyst activation bath the localised R—OH molecules on the surface of the item act as reducing agents to facilitate a reduction of metal ions from the catalyst activation bath, thereby forming catalytic seeds exclusively at the laser-modified areas.

2. The method according to claim 1, wherein the parameters of the ultrashort laser pulses are chosen such that when laser pulse radiation interacts with the material to be plated, a static electric charge occurs on the laser-modified surface of the material due to a Coulomb explosion.

3. The method according to claim 1, wherein the parameters of the ultrashort laser pulses are chosen such that when laser pulse radiation interacts with the material to be plated, a static electric charge occurs on the laser-modified surface of the material due to photochemical ablation including breaking of chemical bonds.

4. The method according to claim 1, wherein the ultrashort pulse laser has a pulse duration in a range of 0.005-500 picoseconds.

5. The method according to claim 1, wherein a wavelength of the ultrashort pulse laser comprises infrared, visible and ultraviolet range, wherein said irradiation dose is in a range of 0.01-200 J/cm2 and a laser scanning speed is in a range of 0.1-20 m/s. and said irradiation dose and scanning speed are chosen such that the laser-irradiated areas become active for hydroxy groups formation and adsorption of R—OH molecule in the pre-treatment solution.

6. The method according to claim 5, wherein irradiation carried out by the ultrashort pulse laser is performed in a burst mode of laser pulses.

7. The method according to claim 5, wherein a laser beam translation is performed with a galvanometric scanner.

8. The method according to claim 5, wherein the laser beam of the ultra-pulse laser is a Bessel beam, shaped with an axicon optical element.

9. The method according to claim 1, wherein humidity of the ambient during the method of selective metal plating is maintained within a range of 15% to 95%.

10. The method according to claim 1, wherein the pre-treatment solution is a mixture of water and alcohol at a concentration rate from 1% to 99.998% alcohol.

11. The method according to claim 1, wherein the item after pre-treatment with a pre-treatment solution is brought into contact with the catalyst activation bath at a time scale from 0.2 s to 10 min.

12. The method according to claim 1, wherein an activation solution of the catalyst activation bath used for chemical activation is an aqueous solution of a metal salt selected from the group of the salts comprising silver (Ag) salt, copper (Cu) salt, nickel (Ni) salt, cobalt (Co) salt, zinc (Zn) salt, chromium (Cr) salt, or tin (Sn) salt.

13. The method according to claim 1, wherein the pre-treatment solution is an alkaline alcohol-containing bath with a pH value higher than 7.0.

14. The method according to claim 10, wherein the pre-treatment solution is an alcohol-containing bath and consists of mono-hydroxyl and/or poly-hydroxyl alcohols.

15. The method according to claim 1, wherein the pre-treatment solution consists of an ethanol and water mixture, or isopropanol and water mixture or pentanol and water mixture, or their mixture thereof.

16. The method according to claim 1, wherein after immersion in the catalyst activation bath, the item is rinsed in water.

17. The method according to claim 1, wherein the item surface to be plated is glass selected from a group consisting of: silicate glass, soda-lime glass, borosilicate glass, fused silica, float glass, aluminosilicate glass, lead glass, borate glass fluorine glass, and phosphate glass.

18. The method according to claim 1, wherein the item surface to be plated is ceramics selected from a group consisting of: alumina, zirconia, SiC, AlN, $Al_2O_3$, silicon nitride, boron nitride, barium titanate, and ferrite ceramics.

19. The method according to claim 1, wherein the item surface to be plated is silicon or germanium.

20. The method according to claim 1, wherein the reduction of metal ions takes place due to formation of a metal oxide and during reaction of metal ions with OH-ions produced after surface modification by the ultrashort pulse laser or after contact with a preparation solution or by reaction with OH ions in an alkaline electroless metal plating bath, and subsequently reducing metal oxide with the alcohol molecule formed after contact with the preparation solution.

21. The method according to claim 20, wherein the reduction of metal ions is due to metal ion or metal oxide reaction with a reducer in the electroless plating bath.

* * * * *

UNITED STATES PATENT AND TRADEMARK OFFICE
CERTIFICATE OF CORRECTION

PATENT NO. : 12,336,114 B2
APPLICATION NO. : 18/340111
DATED : June 17, 2025
INVENTOR(S) : Ratautas et al.

Page 1 of 1

It is certified that error appears in the above-identified patent and that said Letters Patent is hereby corrected as shown below:

In the Claims

In Column 14, Line 55, Claim 14 should read "The method according to claim 1, wherein the pre-treatment solution..."

Signed and Sealed this
Twelfth Day of August, 2025

Coke Morgan Stewart
*Acting Director of the United States Patent and Trademark Office*